United States Patent [19]

Odenheimer et al.

[11] Patent Number: 4,743,844
[45] Date of Patent: May 10, 1988

[54] SELF-ADJUSTING OSCILLOSCOPE

[75] Inventors: Ronald P. Odenheimer, Portland, Oreg.; Kim Hastings, Ardmore, Pa.

[73] Assignee: Tektronix, Inc., Beaverton, Oreg.

[21] Appl. No.: 944,302

[22] Filed: Dec. 19, 1986

[51] Int. Cl.[4] ...................... G01R 13/00; G01R 15/08
[52] U.S. Cl. ................................ 324/121 R; 324/115; 364/487
[58] Field of Search ................. 324/121 R, 77 A, 115; 364/487; 315/364, 367

[56] References Cited
U.S. PATENT DOCUMENTS 3,204,144  8/1965  Deavenport ................. 324/121 R
3,873,918  3/1975  Talbert ........................ 324/115
4,271,391  6/1981  Kmetz ......................... 324/121 R Primary Examiner—Ernest F. Karlsen
Attorney, Agent, or Firm—Daniel J. Bedell; George T. Noe

[57] ABSTRACT

A digital oscilloscope includes an amplifier having adjustable gain and offset for producing an output signal in response to an input signal, a triggering system for producing a trigger status signal when the amplifier output signal reaches an adjustable trigger level, and a digitizer for generating a waveform data sequence representing magnitudes of samples of the amplifier output signal acquired at various times with respect to assertion of the trigger status signal. The oscilloscope produces a waveform display on a screen according to the waveform data sequence produced by the digitizer and automatically adjusts the amplifier gain and offset, the trigger level, and the sampling rate of the digitizer so that the waveform data produced by the digitizer provides for a waveform display suitably representative of the time dependent behavior of the input signal.

10 Claims, 9 Drawing Sheets

SELF-ADJUSTING OSCILLOSCOPE

BACKGROUND OF THE INVENTION

The present invention relates to digital oscilloscopes and in particular to a digital oscilloscope which automatically adjusts a waveform display so that it is adequately representative of an input signal.

In a typical digital oscilloscope, a vertical amplifier amplifies an input signal to produce an output signal, and this output signal is continuously sampled and digitized by a digitizer. Digitized sample data is stored at successive addresses in an acquisition memory. When the current address reaches an upper limit, it is reset to a lower limit and newly acquired sample data is written over previously stored data. A waveform data sequence stored at a particular section of acquisition memory addresses is periodically read out of the acquisition memory and utilized to control the display of a waveform, the magnitude of successive data of the sequence controlling the vertical position on the screen of successive segments of the waveform. The section of acquisition memory addresses providing the waveform data sequence controlling the display is selected to include a set number of sample data values acquired starting with an adjustable number of samples after the amplifier output signal reaches an adjustable trigger level. This permits adjustment of the "horizontal position" of the waveform display on the oscilloscope screen with respect to the triggering event on the waveform.

A waveform display is often considered to be most representative of a periodic input signal when its minimum and maximum peaks appear on the screen and when the vertical distance between minimum and maximum waveform peaks is as large as possible. Also it is desirable that the horizontal time scaling be such that at least one complete cycle of the waveform appears on the screen. However, display of too many cycles can obscure waveform detail due to limitations of display resolution. The trigger level should be set between the maximum and minimum peaks of the amplifier output signal and at a level wherein noise is not likely to cause premature triggering. It is also beneficial to adjust the horizontal position of the waveform so that the triggering event appears other than at one end of the waveform display so that it may be easily seen.

Typically an operator adjusts the horizontal time scale of a waveform by changing the sampling rate at which an input signal is digitized, adjusts the vertical scaling of the waveform display by changing the gain of the vertical amplifier, and adjusts the vertical position of the waveform by changing the magnitude of an offset signal input to the vertical amplifier which causes the amplifier output signal to be shifted upward or downward in magnitude. The operator can also adjust the trigger level by changing the magnitude of a trigger level signal which is compared with a trigger signal (usually the vertical amplifier output signal) to produce a trigger status signal utilized to control termination of waveform digitization. The operator can usually adjust the horizontal position by providing position control data to digitizers.

It is not always easy to properly adjust all of these waveform display control parameters so as to obtain a suitably representative waveform display, nor is it easy to tell when a display is suitably representative, particularly when nothing is known beforehand about the characteristics of an input signal. When the input signal is initially amplified and digitized, it may be that no waveform actually appears on the oscilloscope screen, as for example when the vertical offset signal is too large or too small. Or, if the sampling rate is too high, only a portion of one cycle of the amplifier output signal may be digitized and a periodic input signal may initially appear to be constant. An input signal may also appear to be constant if the gain is set too low. If an input signal is periodically digitized with the trigger level improperly adjusted, the resulting waveform display may be unsteady.

An experienced oscilloscope operator will typically adjust the sampling rate, vertical amplifier gain and offset, trigger level and horizontal position in a systematic fashion to ensure that a suitably representative waveform display is obtained. But an inexperienced oscilloscope operator may not understand all of the adjustments which must be made and may not be aware that a waveform display is not truly representative of the input signal.

When an oscilloscope can display several waveforms, it may be impractical to provide a separate front panel knob or switch for separately controlling each parameter controlling each waveform as well as for controlling other aspects of oscilloscope operation. Some oscilloscopes provide multiple function knobs or switches and/or menus operating in "decision tree" form to permit an operator to control oscilloscope operation utilizing only a few knobs or pushbuttons. In order to change a display attribute of a particular waveform, an operator must first utilize a knob, pushbutton or menu to select the waveform to be adjusted, utilize another knob, pushbutton or menu to select the particular aspect of the waveform display to be changed, and then utilize yet another knob, pushbutton or menu to actually adjust such aspect of the waveform. While oscilloscopes utilizing decision tree control systems minimize the number of front panel pushbuttons and knobs needed to adjust a waveform display, the waveform display adjustment process in such oscilloscopes may be slow and cumbersome even for an experienced oscilloscope operator.

What is needed is an oscilloscope which can automatically adjust a waveform display so as to ensure that it is suitably representative of an input signal.

SUMMARY OF THE INVENTION

The present invention relates to a computer-based digital oscilloscope capable of displaying on a screen a waveform representing the magnitude of an input signal as a function of time. The input signal may be selectively either AC or DC coupled to the input of a vertical amplifier having adjustable gain and offset. The vertical amplifier produces an output signal which is digitized to produce waveform data representing magnitudes of successive output signal samples stored at successive addresses in an acquisition memory. A waveform data sequence stored at a particular section of acquisition memory addresses is periodically read out of the acquisition memory and utilized to control the display of a waveform, the magnitude of successive data of the sequence controlling the vertical position on the screen of successive segments of the waveform. The section of acquisition memory addresses containing the waveform data sequence is selected to include a set number of sample data values acquired starting an adjustable number of samples after the amplifier output signal reaches an adjustable "main" trigger level. This permits adjustment of the "horizontal position" of the waveform display on the oscilloscope screen with respect to a triggering event on the waveform.

The digital oscilloscope includes a "main" trigger comparator for producing a main trigger status signal when an input signal rises above (or falls below) the adjustable main trigger level and a "window" trigger comparator for producing a window trigger status signal when an input signal rises above (or falls below) an adjustable window trigger level. The vertical amplifier gain and offset, the sampling rate, the main and window trigger levels, the triggering direction of the main and window trigger comparators, and the horizontal position of the waveform display are adjusted by a computer-based control system within the oscilloscope. The control system is also adapted to monitor the main and window trigger level signals, to control arming of the trigger comparators, and to control the coupling mode of the input signal.

In accordance with one aspect of the invention, the control system automatically sets the gain of the vertical amplifier to a value for which minimum and maximum peak magnitudes of a waveform are distinctly displayed on the screen. The control system does this by first AC coupling the input signal to the amplifier and setting the offset of the vertical amplifier to zero. The control system initially sets the vertical amplifier gain to a predetermined value and sets the main and widow trigger levels such that the main trigger status signal is produced when the amplifier output signal rises above a predetermined upper limit and such that the window trigger status signal is produced when the vertical amplifier output signal falls below a predetermined lower limit. The upper limit is selected to be substantially near, but less than, the level represented by a point along the upper edge of the screen. The lower limit is selected to be substantially near, but above the level represented by a point along the lower edge of the screen.

The control system then monitors the main and trigger status signals and iteratively decreases and/or increases the amplifier gain according to whether or not the control system detects a main and/or window trigger status signal. The amount and direction of gain increase or decrease follows a search pattern whereby the control system determines the largest gain setting for which peak magnitudes of the digitized waveform data sequence are within a range for which the corresponding waveform peaks appear on the screen within the limits corresponding to the main and window trigger levels.

In accordance with another aspect of the invention, the control system measures the minimum and maximum peak levels of the vertical amplifier output signal and automatically adjusts the main trigger level such that the main trigger status signal is asserted when the vertical amplifier output signal reaches a level between these minimum and maximum peak levels. After the gain setting is adjusted such that peak magnitudes of the digitized waveform data sequence are within a range for which corresponding waveform peaks appear on the screen, the control system monitors the main trigger status signal and iteratively increases and/or decreases the main trigger level according to a search pattern in order to determine the maximum trigger level for which upper peaks of the vertical amplifier output signal cause the main trigger status signal to be asserted. At the same time, the control system monitors the window trigger status signal and iteratively adjusts the window trigger level to determine a minimum trigger level for which lower peaks of the vertical amplifier output signal cause the window trigger status signal to be asserted. The control system subsequently adjusts the main trigger level to a value midway between the maximum and minimum trigger levels thus determined.

In accordance with a further aspect of the invention, the control system sets the main and window trigger comparators to produce their trigger status signals when the vertical amplifier output signal rises above the same predetermined limit but arms the window trigger comparator for producing the window trigger status signal only after the main trigger status signal signal has been asserted. Thus the main and window trigger status signals are asserted one vertical amplifier output signal cycle apart. The main and window trigger status signals are applied to inputs of a timer adapted to generate data indicating the time elapsed between the main and window trigger status signals, thereby indicating the period of the input signal. The control system subsequently adjusts the sampling rate so that a predetermined number of amplifier output signal cycles are displayed.

In accordance with yet another aspect of the invention, the control system is adapted to automatically adjust the offset of the vertical amplifier to a value for which peak magnitudes of the digitized waveform data sequence are within a range for which the corresponding waveform peaks appear on the screen when the input signal is DC coupled to the vertical amplifier input. After the gain has been adjusted and the period of the input signal has been measured while the input signal is AC coupled, the control system DC couples the input signal to the vertical amplifier and sets the sampling rate such that a predetermined number (suitably ten) of cycles of the amplifier output signal are digitized. Thereafter, the control system iteratively adjusts the vertical amplifier offset while monitoring the waveform data sequences produced after each adjustment until values of all data within the waveform data sequence are within bounds for which corresponding portions of a waveform produced therefrom would be displayed within the upper and lower limits of the screen.

In accordance with a still further aspect of the invention, the control system adjusts the horizontal position of the waveform on the screen such that the waveform is displayed with the triggering event at a predetermined horizontal location on the screen, suitably a short distance from the left edge of the screen, so that the triggering event may be easily observed.

It is accordingly an object of the invention to provide an improved oscilloscope which automatically adjusts the gain and offset of its vertical amplifier so that minimum and maximum peaks of a waveform representing an input signal to the amplifier are displayed on the oscilloscope screen.

It is another further object of the invention to provide an improved oscilloscope which automatically measures the period of the vertical amplifier output signal and adjusts the sampling rate of the digitizer so that a predetermined number of periods of the amplifier output signal are digitized and displayed.

It is a further object of the invention to provide an improved oscilloscope which automatically adjusts a trigger level utilized to control digitization of an input signal and which automatically adjusts the horizontal position of the waveform so that the triggering event is displayed at a predetermined horizontal position on an oscilloscope screen.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
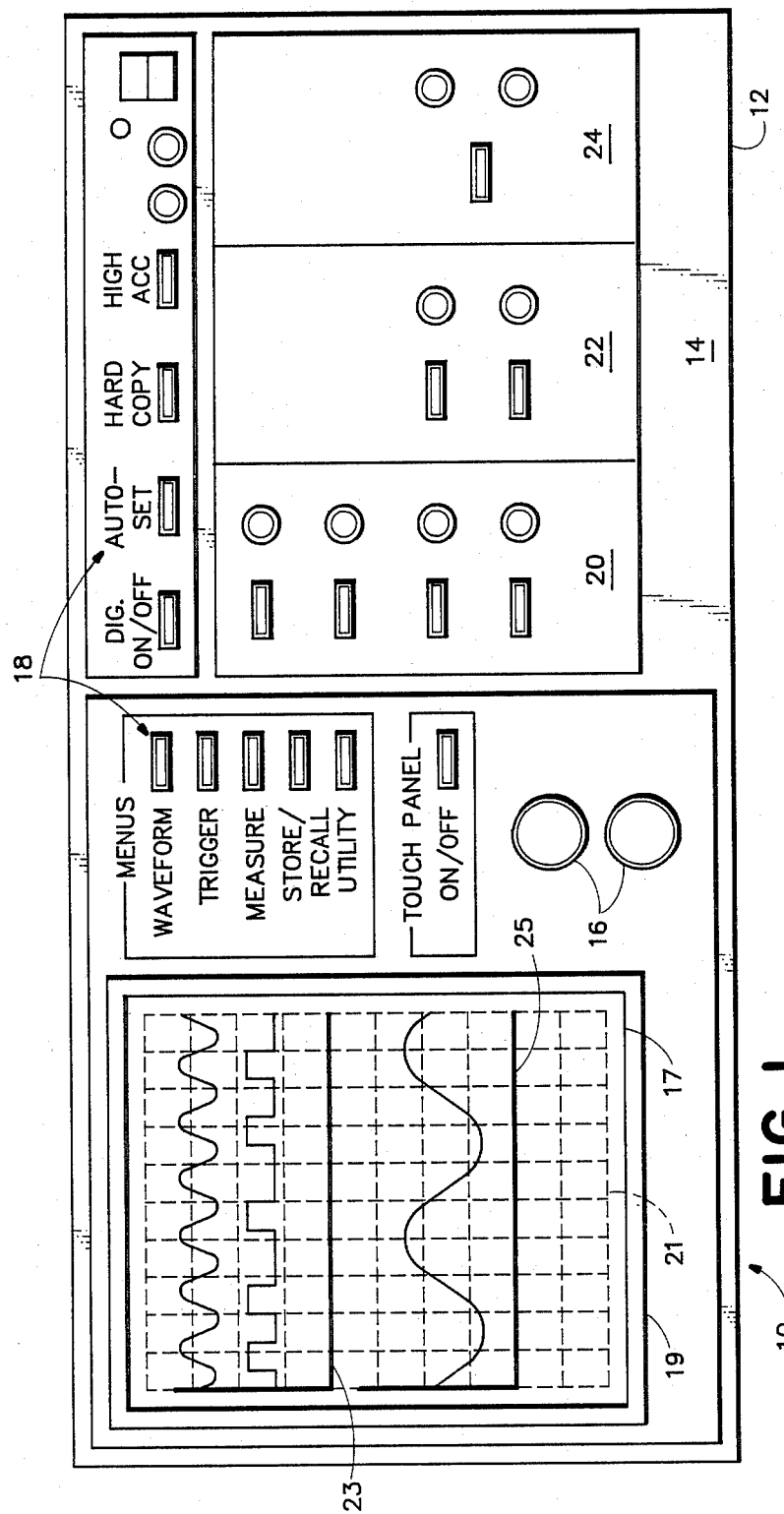
FIG. 1 is a front elevation view of an oscilloscope suitable for utilizing the present invention.

FIG. 1 depicts a front elevation view of a computer-based digital oscilloscope 10 including a main chassis 12, a front panel 14 mounted on the chassis, control knobs 16, a screen 17 and pushbuttons 18 mounted on the front panel, as well as a set of three "plugins" 20, 22 and 24. Each plugin comprises a hardware subsystem of the oscilloscope mounted on a small, removable chassis "plugged" into main chassis 12 through a corresponding slot in front panel 14. The plugins, interconnected with other hardware within chassis 12 through backplane wiring in chassis 12, may include vertical input channel hardware for receiving input signals as well as other equipment. Each plugin includes an individual front panel on which additional pushbuttons, control knobs and jacks may be mounted.

Screen 17 displays waveforms, menus, data and other graphics and text produced by the oscilloscope. Waveforms may represent vertical channel input signals and may be referenced either to a "main" horizontal time base axis 23, or a "window" horizontal time axis 25. A waveform referenced to the window axis may represent a shorter portion of the same input signal represented by a waveform referenced to the main axis. The section of the main axis waveform corresponding to the window axis waveform is highlighted.

The oscilloscope includes a "touchscreen" 19, a mechanism comprising rows of light sources and light sensors distributed around the edge of the screen 17 for providing input data to the oscilloscope indicating locations on the screen touched by an operator's finger. The touchscreen 19 is useful, for example, in permitting an operator to make selections from menus displayed on the screen, which menu selections cause the oscilloscope to configure itself for various modes of operation. A grid 21 is superimposed on the screen 17 to assist an operator to measure vertical and horizontal displacements of points along waveforms displayed on the screen.

Figure 2:
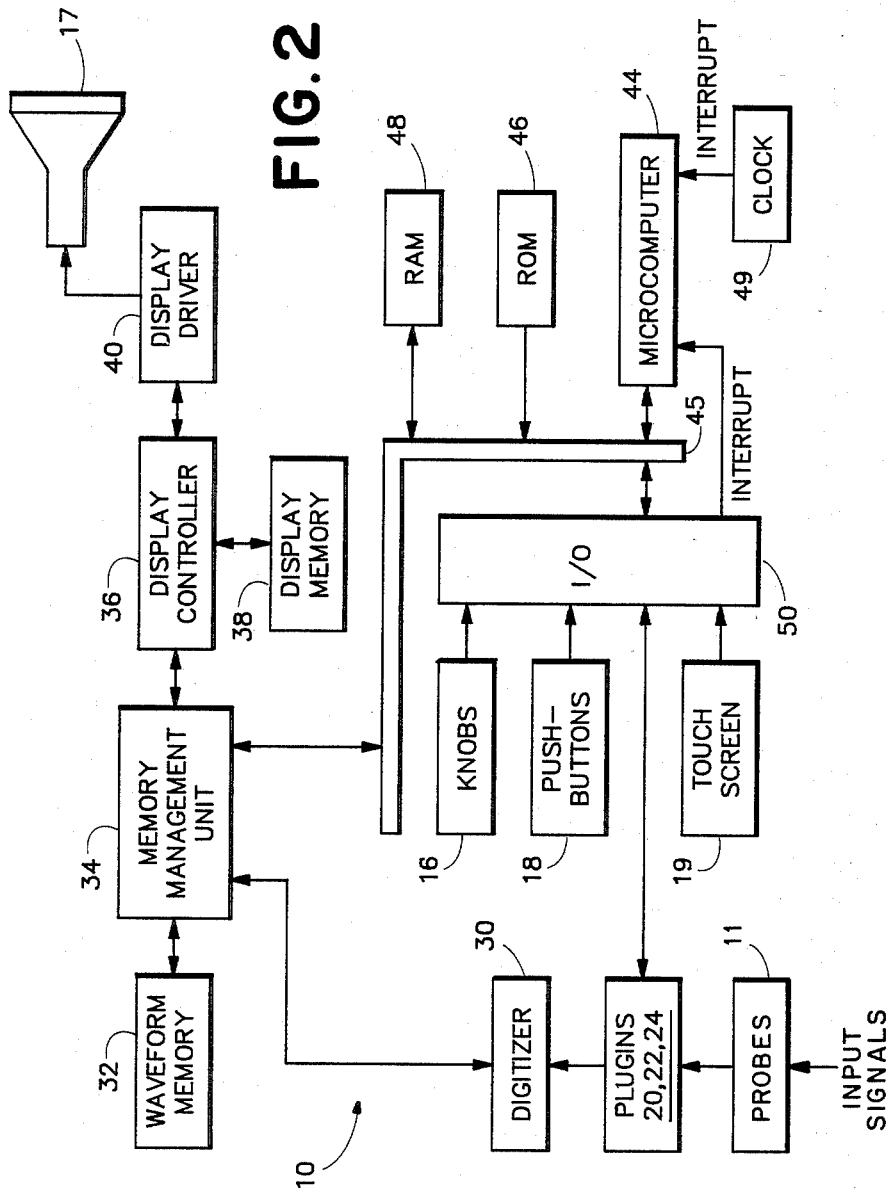
FIG. 2 is a block diagram of the oscilloscope of FIG. 1.

FIG. 2 is a block diagram of the oscilloscope 10 of FIG. 1. Input signals, produced by devices under test and applied as inputs to oscilloscope 10 through probes 11 connected to jacks on plugins 20, 22 and 24, are preconditioned by vertical amplifiers and comparators within the plugins and applied as vertical channel and triggering inputs to a digitizing system 30. The digitizing system 30 digitizes selected vertical channel signals from the plugins to produce sequences of waveform data representing the magnitude of successive vertical input signal samples, and transmits these waveform data sequences for storage in a waveform memory 32 by way of a memory management unit 34, which arbitrates competing demands for access to the waveform memory 32. Memory management unit 34 is described in detail in copending U.S. patent application No. 912,024, filed Sept. 25, 1986, entitled "Concurrent Memory Access System", incorporated herein by reference.

Through memory management unit 34, a display controller 36 acquires waveform data sequences stored in waveform memory 32 and utilizes these sequences to create instructions for an oscilloscope display, the instructions being stored in a display memory 38. The display controller 36 periodically acquires information from the display memory 38. The display controller 36 periodically acquires information from the display memory 38 and transmits it to a display driver 40 which produces a display on the cathode ray tube screen 17 of the oscilloscope 10 according to the instructions.

The memory management unit 34 also provides an "executive" microcomputer 44 with read and write access to waveform memory 32 by way of a computer bus 45 including control, data and address lines. Executive microcomputer 44 suitably comprises an Intel model 80286 microprocessor and may include an Intel 80287 arithmetic coprocessor for performing fast arithmetic operations and an Intel 82258 direct memory access (DMA) controller for fast I/O operations. Executive microcomputer 44 operates under control of software (sometimes called "firmware") stored in a read only memory (ROM) 46 and utilizes a RAM 48 for temporary data storage, ROM 46 and RAM 48 being accessed through bus 45. Microcomputer 44 carries out a number of functions including, for example, control of plugins 20, 22 and 24, digitizing system 30, and display controller 36. The microcomputer 44 provides control input signals to plugins 20, 22, and 24 through bus 45 to which the plugins are connected by means of bus input/output (I/O) interface circuitry 50. Microcomputer 44 may further control digitizing system 30 operating modes through commands sent over bus 45 and stored in waveform memory 32 by way of memory management unit 34, the stored commands being subsequently read out of memory 32 by digitizer 30. Microcomputer 44 determines which stored waveform data sequences display controller 36 is to display by sending commands to memory management unit 34 telling it to obtain selected waveform sequences from memory 32 and to transmit them to the display controller 36. Microcomputer 44 also controls the display of menus, graphics and data on screen 17 by storing display control data in waveform memory 32 and commanding memory management unit 34 to forward that data to the display controller 36.

Input signals, produced by operation of the oscilloscope main front panel knobs 16 and pushbuttons 18, by operation of knobs, pushbuttons or switches on the individual front panels of plugins 20, 22, or 24, and by operation of the touchscreen 19, are sensed by the I/O circuitry 50 which transmits indicating data to executive microcomputer 44 in response thereto. In response to such data, microcomputer 44 configures various subsystems of the oscilloscope for selected modes of operation. Firmware for controlling the display of menus and other operations of microcomputer 44 in response to operation of oscilloscope front panel pushbuttons and the touchscreen is described in copending U. S. patent application No. 902,363, filed Aug. 29, 1986, entitled "Menu-based Oscilloscope Operating State Configuration System".

The touchscreen 19 suitably comprises a row of 11 light emitting diodes (LEDs) mounted across the top edge of the screen 17 and a column of 22 LEDs mounted along the left side of the screen. The LEDs are arranged to produce an 11×22 grid of light beams immediately in front of the screen 17. A set of 33 photodetectors is positioned along the bottom and right edges of the screen so that a separate photodetector is able to detect the light beam produced by each LED when the beam reaches the edge of the screen directly opposite the LED. When the operator touches the screen, his finger may prevent one or more light beams from reaching photodetectors positioned to detect them. Each photodetector produces an output signal of the state indicating whether the photodetector currently detects the light beam produced by the corresponding LED. The I/O circuitry 50 includes a scanning circuit for monitoring the output signals produced by the photodetectors and storing data indicating the states thereof. Whenever the scanner determines the state of at least one of the photodetector output signals has changed, it transmits an interrupt signal to executive microcomputer 44, and suspends its scanning operation. When the microcomputer 44 receives the interrupt signal, it reads all the data stored by the scanner and determines from this data whether and where the operator is touching the screen. Once the microcomputer has acquired and processed the scanner data, it transmits an end interrupt command to the scanner which signal tells the scanner to resume its scanning operation.

The executive microcomputer 44 views the screen as a grid of rectangular "touch zones" wherein each intersection of a horizontal and a vertical light beam comprises the center of a separate touch zone. When the executive microcomputer 44 determines from the input data from the I/O circuitry 50 that the operator has touched a particular touch zone, it checks to see if the touch zone is included within a menu displayed on the screen. If so, and if the touch zone is included within a selectable menu item, the microcomputer changes the operating state of the oscilloscope according to the operator's selection. If the executive microcomputer 44 determines that the operator has touched an area on the screen not within the borders of a displayed menu, then the microcomputer determines from the data in waveform memory 32 whether any portion of any displayed waveform passes through the touch zone touched by the operator. If some portion of a particular waveform passes through the touch zone, it is assumed that the operator has "selected" that waveform and microcomputer 44 reconfigures the oscilloscope to subsequently carry out such operations as may be relevant to an operator-selected waveform utilizing that particular waveform as the operator-selected waveform. Software and hardware utilized in conjunction with touchscreen operations are described in copending U.S. application No. 944,304, entitled "Waveform Selection by Touch", filed Dec. 19, 1986.

According to the present invention, oscilloscope 10 is adapted to automatically adjust the vertical gain, vertical offset, sampling rate, trigger level and trigger position utilized in the course of digitizing an input signal so as to ensure that a waveform representing the input signal according to digitized waveform data is properly displayed on the screen 17. In order to explain how the oscilloscope does this, it is necessary to describe a typical vertical input channel as may be included in one or more of the plugins 20, 22 and 24 and to describe relevant portions of the digitizing system 30 of FIG. 2.

Figure 3:
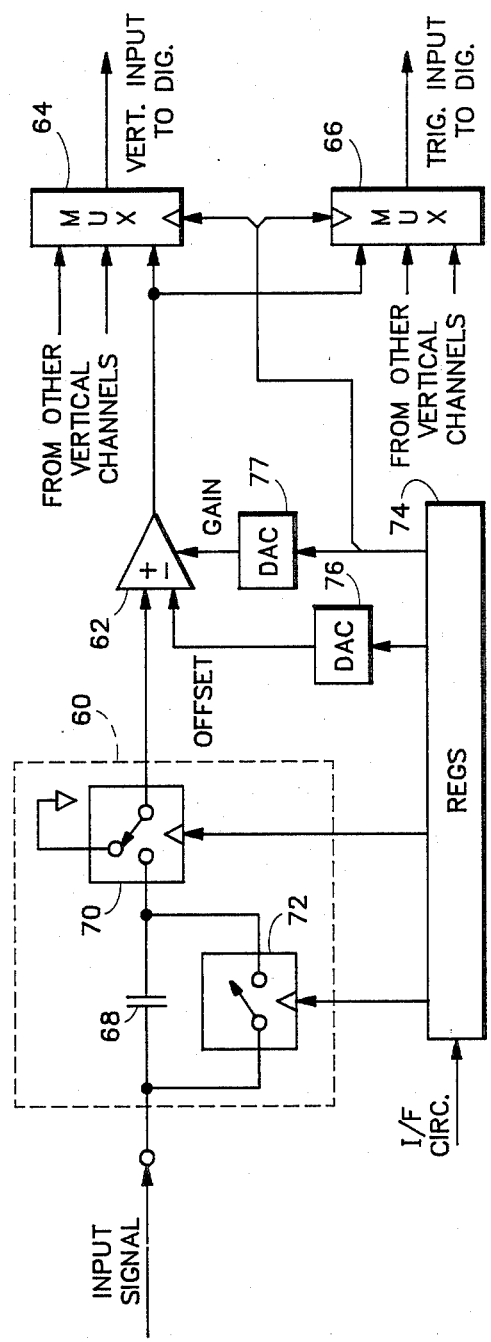
FIG. 3 is a block diagram of a portion of a vertical input channel of a plugin of FIG. 2.

FIG. 3 depicts in block diagram form a typical vertical input channel of a plugin. An input signal is connected through a probe coupling circuit 60 to the input of a vertical amplifier 62, and a resulting vertical amplifier output signal may be transmitted through a multiplexer 64 as a vertical input signal to the digitizing system 30 of FIG. 2. Output signals produced by vertical amplifiers of other vertical input channels of the same plugin are provided as additional inputs to multiplexer 64. The output signal of vertical amplifier 62, along with the output signals of the other vertical amplifiers on the plugin are also applied as inputs to another multiplexer 66 which provides a selected one of its input signals as a trigger input signal to the digitizing system.

The probe coupling circuit 60 includes a capacitor 68 for AC coupling the input signal to a noninverting input of amplifier 62 through a switch 70. Another switch 72 is provided to selectively shunt capacitor 68 so that the input signal may be DC coupled to the noninverting input of amplifier 62 through switch 70. Switch 70 permits the noninverting input of amplifier 62 to be selectively grounded for amplifier calibration purposes. The switching positions of switches 70 and 72, as well as the switching positions of multiplexers 64 and 66, are controlled by data stored in a set of registers 74, the data being supplied to the registers by executive microcomputer 44 of FIG. 2 via I/O circuitry 50. Data stored in one of registers 74 is also provided as input to a digital-to-analog converter (DAC) 76 which produces an offset signal in proportion to the magnitude of the input data. The offset signal is supplied to an inverting input of vertical amplifier 62 and causes the amplifier to shift its output signal upward or downward proportional to the magnitude of the offset signal, which may be either positive or negative. Data stored in one of registers 74 is also supplied as input to another DAC 77 which produces a signal for controlling the gain of vertical amplifier 62.

Figure 4:
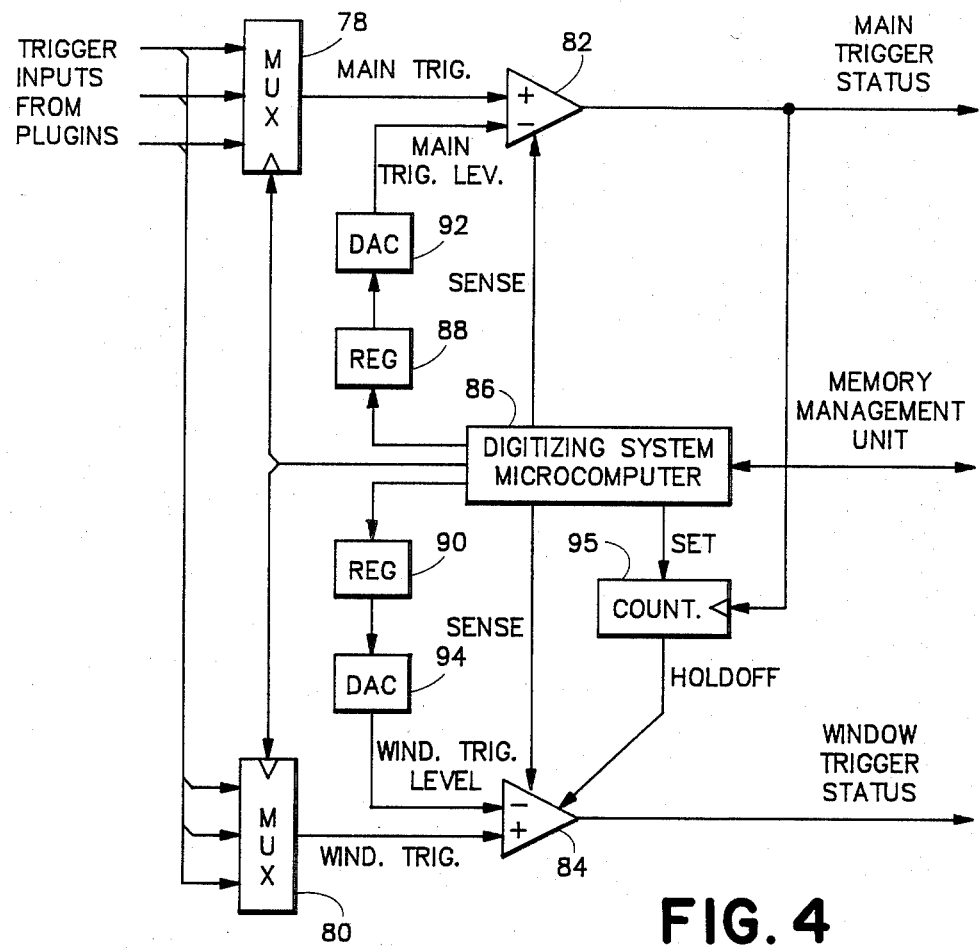
FIG. 4 is a block diagram of main and window trigger systems included with the digitizing system of FIG. 2.

FIG. 4 is a block diagram of triggering circuitry within digitizing system 30 of FIG. 2. The output signal produced by multiplexer 66 of FIG. 3, along with output signals produced by similar multiplexers in other plugins, are provided as inputs to a multiplexer 78 and a multiplexer 80 of FIG. 4. Multiplexer 78 transmits a selected one of its inputs as a "main" trigger signal to a noninverting input of a "main" trigger comparator 82. Multiplexer 80 transmits a selected one of its inputs as a "window" trigger signal to a noninverting input of a "window" trigger comparator 84. A microcomputer 86, included in the digitizing system, controls the switching positions of multiplexers 78 and 80 and also supplies data input to a pair of registers 88 and 90. The data stored in register 88 is supplied as input to a DAC 92 and the data stored in register 90 is supplied as input to a DAC 94. DAC 92 produces a "main" trigger level signal output in proportion to the (positive or negative) magnitude of its input data and this main trigger level signal is applied to an inverting input of comparator 82. Similarly, DAC 94 produces a window trigger level signal output in proportion to the magnitude of its input data from register 90, and this trigger level signal is applied to an inverting input of comparator 84.

Microcomputer 86 provides "sense" signals to comparators 82 and 84 which tell the comparators whether to assert their outputs when their trigger signal inputs rise above or fall below their trigger level inputs. Microcomputer 86 also sets the count limit of a counter 95 which counts the number of times comparator 82 asserts the main trigger status signal. When the number of assertions reaches the count limit, counter 95 deasserts a "holdoff signal" applied to comparator 84. The holdoff signal, when asserted, prevents comparator 84 from asserting its window trigger status output signal.

Figure 5:
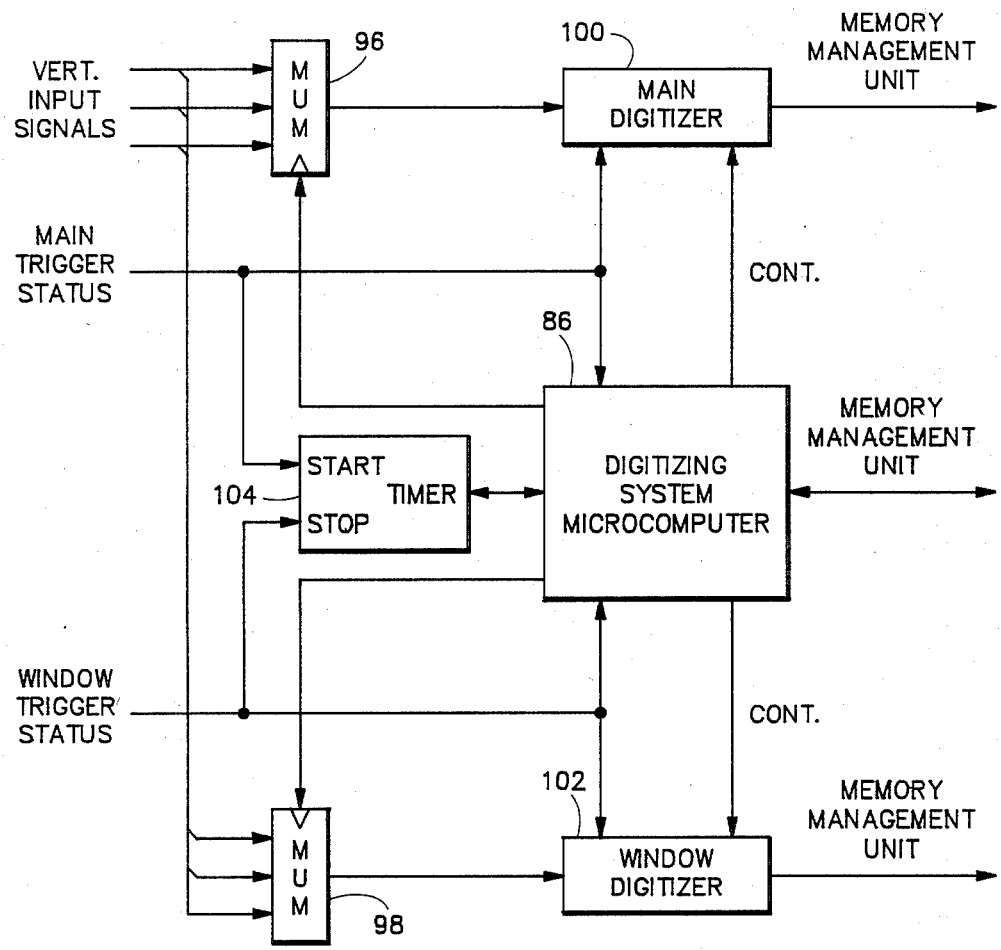
FIG. 5 is a block diagram showing main and window digitizing systems included with the digitizer of FIG. 2.

FIG. 5 shows a block diagram of additional circuitry within digitizing system 30 of FIG. 2. The output signal produced by multiplexer 64 of FIG. 3, along with output signals produced by similar multiplexers in other plugins, are supplied as inputs to a pair of multiplexers 96 and 98 of FIG. 5. Multiplexer 96 transmits its output to a "main" digitizer 100 which samples the multiplexer 96 output signal at regular intervals, converts each sampled signal magnitude to representative digital data, and stores successively acquired data at successive addresses in an acquisition memory included therein during each "acquisition cycle". The main digitizer operates continuously, replacing previously acquired data in the acquisition memory with newly acquired data during each successive acquisition cycle. A waveform data sequence stored at a particular section of acquisition memory addresses is periodically read out of the acquisition memory and transmitted to the memory management unit for subsequent use in controlling the display of a waveform. The section of acquisition memory addresses containing the waveform data sequence is selected to include a set number of sample data values acquired for starting an adjustable number of samples after the main trigger status signal is first asserted during the current acquisition cycle. This permits adjustment of the "horizontal position" of the waveform display on the oscilloscope screen with respect to a triggering event on the waveform.

The sampling rate of the main digitizer is controlled according to control data and signals supplied by digitizing system microcomputer 86. The main trigger status signal output of comparator 82 of FIG. 4 is applied as an input to microcomputer 86 so that it can determine when the main trigger status signal has been asserted. The microcomputer 86 also monitors the window trigger status signal. Executive microcomputer 44 of FIG. 2 communicates with the digitizing system microcomputer 86 of FIG. 5 by storing commands in the waveform memory 32 by way of memory management unit 34 and then requesting the memory management unit to transfer the commands from the waveform memory to microcomputer 86. Similarly, the digitizing system microcomputer 86 may transmit information to executive microcomputer 44 of FIG. 2 by storing the information in the waveform memory, which information is then read out of the waveform memory by executive microcomputer 44.

Multiplexer 98 transmits its output signal to a "window" digitizer 102, similar to main digitizer 100. The window trigger status signal produced by comparator 84 of FIG. 4 is supplied as a triggering input to digitizer 102 and also as an input to microcomputer 86. Digitizing system microcomputer 86 also controls the sampling rate of window digitizer 102 through control signals and data supplied thereto. The main digitizer 100 is utilized to digitize input signals to be represented by waveforms referenced to the main horizontal axis 23 of FIG. 1, while the window digitizer 102 is utilized to digitize input signals represented by waveforms referenced to the window horizontal axis 25 of FIG. 1. Use of two digitizers permits one input signal to be simultaneously sampled and digitized at two different sampling rates. The main and window trigger status signals produced by comparators 82 and 84 of FIG. 4 are also applied to "start" and "stop" inputs of a timer 104 which transmits output data to microcomputer 86 indicating the time period between the main and window trigger status signals. Timer 104 operation may be armed by a control signal from digitizing system microcomputer 86.

In accordance with the present invention, the oscilloscope is adapted to automatically adjust the vertical amplifier's gain and offset, each digitizer's sampling rate, the main and window trigger levels and the main and window horizontal positions so as to ensure that a waveform suitably representative of an input signal is displayed on the screen. When a waveform representing an input signal to a vertical channel of one of the plugins 20, 22 and 24 of FIG. 2 is displayed on the screen 17, an oscilloscope operator may initiate an automatic adjustment ("autoset") operation by first utilizing the touch screen to select the waveform and then depressing one of the pushbuttons 18 on the front panel 14 of oscilloscope 10 shown in FIG. 1. Executive microcomputer 44 of FIG. 2 determines, from touchscreen 19 and pushbutton 18 input data provided to the microcomputer via I/O circuitry 50, that the operator has selected a particular waveform, and that the operator is requesting that an autoset operation be performed on that waveform. Executive microcomputer 44 then executes "autoset" programs stored in ROM 46, which programs cause the microcomputer to properly adjust the vertical amplifier gain and offset, and the main or window digitizer's sampling rate, trigger level and horizontal position, depending on which digitizer is producing the waveform data controlling the display of the selected waveform.

The gain of vertical amplifier 62 of FIG. 3 is expressed in terms of the scaling of the waveform display resulting from the gain setting, i.e., in volts per vertical division of grid 21 of FIG. 1. For example, when the gain of amplifier 62 is set for "1.0 volt/division", the gain is such that a one volt change in the input signal would shift the resulting waveform display by one vertical grid division on the screen. In the preferred embodiment of the invention, each vertical amplifier gain may be adjusted in steps to produce waveform scaling of 0.001, 0.002, 0.005, 0.01, 0.02, 0.05, 0.1, 0.2, 0.5, 1.0, 2.0, 5.0, and 10.0 volts per division. Note the repetitive "1-2-5" pattern. Trigger levels are also referenced to grid division. For example, if the gain is set at 1 volt-/division, and the main trigger level is set at 1 division, the main trigger comparator will produce the main trigger status signal when the amplifier input signal reaches 1 volt.

Figure 6:
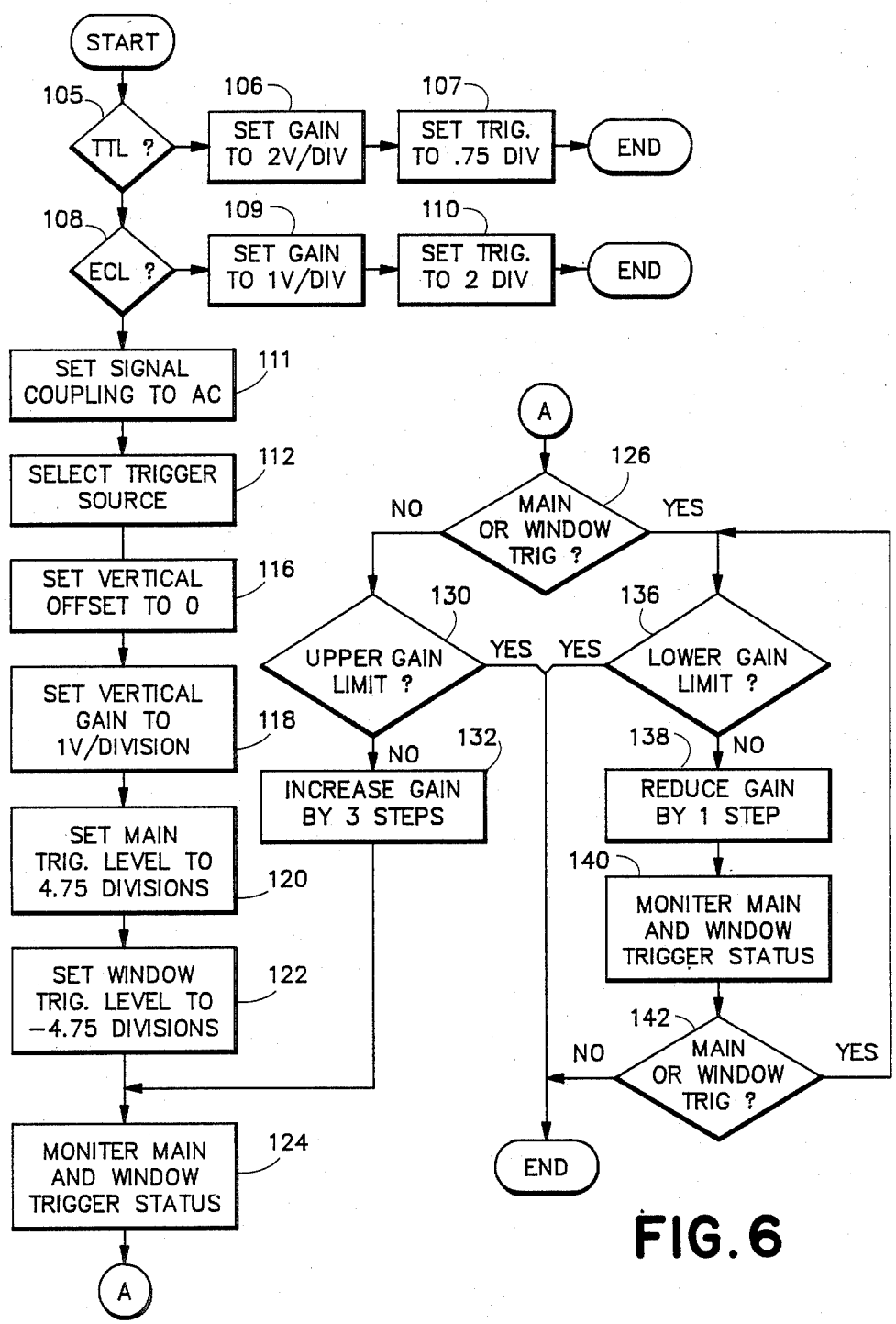
FIG. 6 is a flow chart for programming the computer of FIG. 2 according to the present invention, to adjust the gain of an amplifier of the vertical input system of FIG. 3.

A gain autoset program according to the present invention is depicted in flow chart form in FIG. 6. In the preferred embodiment of the invention, the operator may utilize a menu to tell the executive microcomputer that input signals are at transistor-transistor logic (TTL) or emitter-coupled logic (ECL) levels when the operator knows beforehand that input signals will be at these levels. Starting in block 105, the executive microcomputer checks to see if the operator has previously indicated that input signals are to be at TTL levels, and if so it automatically sets the gain of the vertical amplifier to 2 volts/division (block 106), a suitable gain for TTL level signals, and sets the trigger level to 0.75 divisions (block 107). If the operator has previously indicated that input signals are to be at ECL levels (block 108), then the executive microcomputer sets the vertical amplifier gain to 1 volt/division (block 109) and sets the trigger level to 2 divisions (block 110). The executive microcomputer adjusts the gain of the vertical amplifier 62 of FIG. 3 by transmitting control data to registers 74 of FIG. 3 via I/O circuitry 50 which data causes DAC 77 to produce a gain control signal of magnitude sufficient to adjust the gain of amplifier 62 as desired. If the operator has not indicated that the input signals is at TTL or ECL levels, then the executive microcomputer determines an appropriate gain setting for the input signal by measuring its amplitude. Starting in block 110, the executive microcomputer 44 transmits control data through I/O circuitry 50 of FIG. 2 for storage in registers 74 of FIG. 3 and this data causes the input signal to be AC coupled to the noninverting input of amplifier 62 by opening switch 72 and setting switch 70 so that it connects capacitor 68 to amplifier 62. Next (block 112 of FIG. 6), the executive microcomputer transmits data to registers 74, causing multiplexer 66 to transmit the output of vertical amplifier 62 as the trigger input signal to the digitizer and transmits commands to the digitizing system microcomputer 86 of FIG. 4, causing it to set multiplexers 78 and 80 to select the output of multiplexer 66 as the trigger signal inputs to main trigger comparator 82 and window trigger comparator 84.

In block 116 of FIG. 6, the executive microcomputer transmits data for storage in one of registers 74 of FIG. 3, causing DAC 76 to generate an offset signal output which in turn causes amplifier 62 to produce its output signal with zero offset. (The magnitude of the offset signal output of DAC 76 will normally not be set to zero but will be set to a value sufficient to cancel the effects of any inherent offset in amplifier 62.) In block 118, FIG. 6, executive microcomputer 44 transmits control data to registers 74 of FIG. 3 via I/O circuitry 50 which data causes DAC 77 to produce a gain control signal of magnitude sufficient to adjust the gain of amplifier 62 for 1.0 volt/division scaling. With these gain and offset settings, the midpoint of the 10 vertical grid divisions represents 0 volts, the upper grid line represents an amplifier input signal magnitude of 5 volts, and the lower grid line represents an amplifier input signal magnitude of −5 volts.

In block 120 of FIG. 6, executive microcomputer 44 transmits commands to the digitizing system microcomputer 86 of FIG. 4 telling it to set comparator 82 to assert the main trigger status signal when its trigger signal input rises above the trigger level input, and to set the value of data in register 88 such that DAC 92 produces a main trigger level signal for a trigger level equivalent to the voltage represented by +4.75 grid divisions (i.e. 4.75 volts) above the vertical center of the screen (i.e. 4.75 volts). In block 122, executive microcomputer 44 transmits commands to digitizing system microcomputer 86 telling it to set comparator 84 of FIG. 4 to assert the window trigger status signal as its trigger signal input falls below its trigger level input. The commands also tell digitizing system microcomputer 86 to set the value of data in register 90 so that DAC 94 produces a trigger level signal of magnitude such that the input signal must fall to a level represented by 4.75 grid divisions below the vertical center of the screen (i.e. −4.75 volts) in order to cause comparator 84 to assert the window trigger status signal.

In block 124, the executive microcomputer commands the digitizing system microcomputer 86 to monitor the main and window trigger status signals and then after about 20 milliseconds, the executive microcomputer requests the digitizing system microcomputer to return a message indicating whether the main and window trigger status signals were asserted. If neither of the main and the window trigger status signals are asserted during the acquisition cycle (block 126), and the current gain setting is not at its upper limit (block 130), the executive microcomputer increased the vertical amplifier gain by three steps (block 132).

Recall that the vertical amplifier gain is adjustable in steps having a "1-2-5" pattern. Since gain is initially set for 1 volt/division scaling, a three-step gain increase results in 0.1 ( volt/division vertical scaling. The gain settings of 0.5 and 0.2 volts are bypassed. The program then returns to block 124 where the executive microcomputer again tells the digitizing system microcomputer to monitor the main and window trigger status signals. If, after the digitizing system microcomputer still does not detect assertion of either of the main or the window trigger status signals during the next 20 mSec (block 126), and the upper gain limit (0.001 volts/-division) has not been reached (block 130), the gain is again increased by three steps (to 0.01 volts/division) and the program returns to block 124.

The program continues to loop through blocks 124-130, increasing the gain by three steps with each pass through the loop, until in block 130 the upper gain limit is reached, or until in block 126 assertion of one or both of the main and window trigger status signals is detected. If the upper gain limit is reached in block 130, the program ends. In such case, the input signal is small in magnitude and the lowest gain setting (0.001 volts/- division) is used. However, if a trigger status signal is detected in block 124, and if the gain setting is not at its lower limit (block 136), then the gain is increased by one step (block 138), and the main and window trigger status signals are again monitored for another 20 milliseconds (block 140). If the main and/or the window trigger status signals were asserted (block 142), then the program returns to block 136. The program continues to loop through blocks 136-142, decreasing the gain by one step during each loop, until (block 136) the gain reaches its lower limit, 10 volts/division, or until no main or window trigger signal is asserted (block 142). In either case the program ends and the gain remains at its last setting. Thus, according to the gain adjustment algorithm charted in FIG. 6, the vertical amplifier gain is increased in three-step increments until a main or a window trigger status signal is detected, and then decreased one step at a time until no trigger status signal is detected. This approach permits the appropriate gain setting to be established in relatively few acquisition cycles. The periods during which the trigger status signals are monitored are selected to be relatively long (20 msec) to ensure that at least one cycle of the input signal is monitored, provided the input signal has a frequency of at least 50 Hz.

In establishing the gain, the trigger levels were adjusted so that a main trigger status signal is asserted only if an upper peak of the input signal rises above the value represented by the +4.75 grid division level and such that the window trigger status signal is asserted only if a lower peak of the input signal falls below the value represented by the −4.75 grid division level. Thus, the algorithm sets the gain of vertical amplifier 62 of FIG. 3 to the maximum value for which the upper and lower peak levels of the waveform appear on the screen, between the +4.75 and −4.75 vertical grid division levels when the input signal is AC coupled to the amplifier, provided that the AC component of the input signal is within the limits of the lowest vertical gain setting.

The executive microcomputer 44 executes a program for measuring the maximum and minimum peaks of the amplifier output signal so that it may set the trigger level to be used when digitizing the vertical amplifier output signal to a value midway between its maximum and minimum peaks. A binary search method is utilized to measure the maximum peak of the amplifier output signal wherein the main trigger status signal produced by comparator 82 of FIG. 4 is monitored during each of several successive acquisition cycles while iteratively increasing or decreasing the trigger level output of DAC 92 by progressively smaller amounts prior to each acquisition cycle. The main trigger level is increased if a main trigger status signal was detected during the previous acquisition cycle and decreased if the main trigger status signal was not detected. After a few iterations, the last trigger level output of DAC 92 is substantially equal to the maximum peak of the vertical amplifier output signal. At the same time, the minimum peak of the vertical amplifier output signal is measured by monitoring the window trigger status signal produced by comparator 84 and iteratively increasing or decreasing the trigger level output of DAC 94 by progressively smaller amounts prior to each 20 msec acquisition cycle, depending on whether the window trigger status signal was asserted during the previous acquisition cycle. The magnitude of the last trigger level signal output of DAC 94 is approximately equal to the minimum peak of the vertical amplifier output signal.

In performing the binary search for the maximum and minimum peaks, use is made of information acquired by executive microcomputer 44 during the gain setting program of FIG. 6 in order to reduce the range of input signal magnitudes over which the search for minimum and maximum peak levels is conducted. Recall that in order to set the gain, the vertical amplifier gain is increased in three-step increments until a main or a window trigger status signal is detected, and then decreased one step at a time until no trigger status signal is detected. The trigger levels are adjusted each time the gain is adjusted so that a main trigger status signal is asserted only if an upper peak of the input signal rises above the value represented by the +4.75 grid division level, and such that the window trigger status signal is asserted only if a lower peak of the input signal falls below the value represented by the −4.75 grid division level. Recall also that the gain settings have a repetitive "1-2-5" pattern such that, as the gain setting is increased or decreased by one step, the gain changes by a factor of either 2 or 2.5.

If the main trigger status signal was asserted during the acquisition cycle prior to the last gain reduction, then the maximum peak of the waveform display following the last gain reduction will fall between the +4.75 division level and the +4.75/2.5 division level, and thus the binary search for the peak is restricted to this range. If the main trigger status signal was not asserted during the acquisition cycle immediately prior to the last gain reduction, then the maximum peak of the waveform display following the last gain reduction must be between 0 and 4.75/2 divisions. In such case, the binary search for the maximum peak is restricted to this range. Similarly, if the window trigger status signal was asserted during the acquisition cycle prior to the last gain reduction, then the minimum peak of the waveform display following the last gain reduction will fall between the −4.75 division level and the −4.75/2.5 division level, and thus the binary search for the minimum peak is restricted to this range. If the window trigger status signal was not asserted during the acquisition cycle immediately prior to the last gain reduction, then the minimum peak of the waveform display following the last gain reduction must be between 0 and −4.75/2 divisions and the binary search for the minimum peak is restricted to this range.

Figure 7:
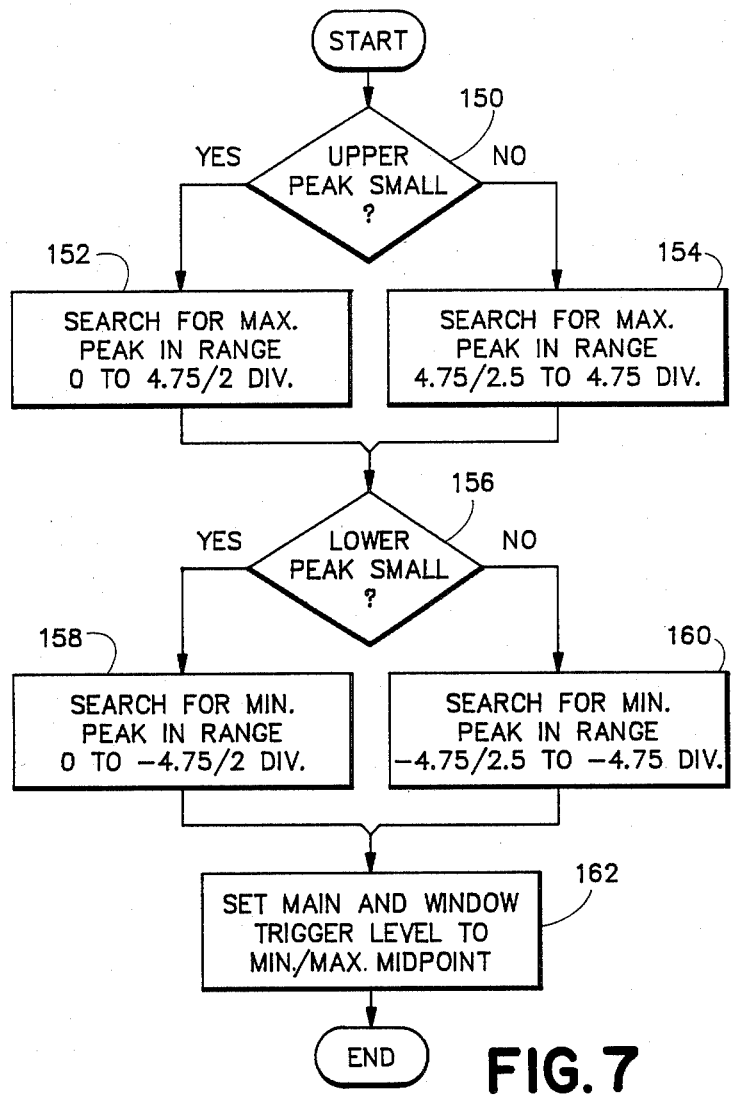
FIG. 7 is a flow chart for programming the computer of FIG. 2 according to the present invention to adjust main and window trigger level signals utilized in the trigger systems of FIG. 4.

FIG. 7 is a flow chart for a program for determining the maximum and minimum peak levels of the input signal. Starting in block 150, executive microcomputer 44 determines from the history of operation of the gain adjustment algorithm of FIG. 6 whether or not the maximum (upper) peak of the waveform is small, i.e., whether it is between 0 and +4.75/2 divisions. If so, a binary search for a main trigger level substantially equal to the maximum peak level of the vertical amplifier output signal is performed (block 152) as previously described for the range of voltages corresponding to 0 to +4.75/2 vertical grid divisions. On the other hand, if the maximum peak of the vertical amplifier output signal is large, between +4.75 and 4.75/2.5 divisions, the binary search for the trigger level corresponding to such maximum peak is performed in that range (block 154). In block 156 executive microcomputer 44 determines from the history of operation of the gain adjustment algorithm whether or not the minimum (lower) peak of the waveform is small (in a negative sense), i.e., whether it is between 0 and −4.75/2 divisions. If so, the binary search in that range is performed (block 158). If the lower peak is large (in the negative sense), i.e., between −4.75 and −4.75/2.5 divisions, the binary search for the minimum peak is performed in that range (block 160).

Although blocks 158 and 160 are shown in FIG. 7 as occurring after blocks 152 and 154, it should be understood that they may be performed concurrently. That is, at the same time that a binary search for a maximum peak is performed in block 152 or 154, a binary search for the minimum peak may be performed in one of blocks 158 and 160. Once the minimum and maximum peaks are determined, the executive microcomputer 44 sends a command to the digitizing system microcomputer to set both the main and window trigger levels so that main and window trigger status signals are produced as the input signal rises above a level representing the midpoint of the range between its minimum and maximum values as indicated by the last main and window trigger levels utilized during the binary search process (block 162) and the program ends.

At this point the input signal is AC coupled to the vertical amplifier and the gain is adjusted so that the waveform representing the input signal is contained within the vertical bounds of the screen. When the input signal is subsequently DC coupled to the vertical amplifier, the waveform may disappear from the screen if the input signal contains a substantial positive or negative DC component because the magnitude of the vertical amplifier output signal will be substantially shifted in the positive or negative direction. Thus according to the present invention, the executive microcomputer 44 executes a program by which it switches the vertical input channel to DC coupling and adjusts the offset signal supplied to the vertical amplifier to offset any DC component in the input signal.

After DC coupling the input signal to the vertical amplifier, the executive microcomputer 44 determines if the waveform appears on the screen by inspecting the values of the waveform data sequence produced by the digitizer and stored in the waveform memory. If the absolute value of any data of the sequence is too large, then the executive microcomputer knows that at least one point of a waveform produced therefrom will not be displayed on the screen. If so, the executive microcomputer adjusts the vertical amplifier offset signal to shift the magnitude of the amplifier output signal upward or downward as necessary so that the minimum and maximum peaks of the resulting waveform appear on the screen.

To adjust the offset, the executive microcomputer 44 utilizes another search method wherein the waveform data sequence is inspected after each data acquisition cycle, and the vertical offset is increased or decreased by progressively smaller amounts until the data values of the waveform data sequence indicate that the waveform representing the DC coupled input signal is displayed within the upper and lower bounds of the screen. However, prior to performing the search, the sampling rate of the digitizer is set such that the waveform data sequence produced thereby represents a moderate number (for example 10) of input signal cycles. This is beneficial because if the sampling rate is too slow, not enough samples may be taken during each period to fairly represent the shape of the input signal and if the sampling rate is too fast, a complete waveform cycle may not be digitized. In order to determine the proper sampling rate setting, the microcomputer utilizes the timer 104 of FIG. 5 to measure the period between successive cycles of the input signal. Once the offset is adjusted, the sampling rate of the digitizer is adjusted so that about three periods of the waveform are displayed on the screen, and the horizontal position is adjusted so that the triggering event on the waveform appears about one horizontal grid division from the left side of the screen so that the triggering event may be easily viewed.

Figure 8:
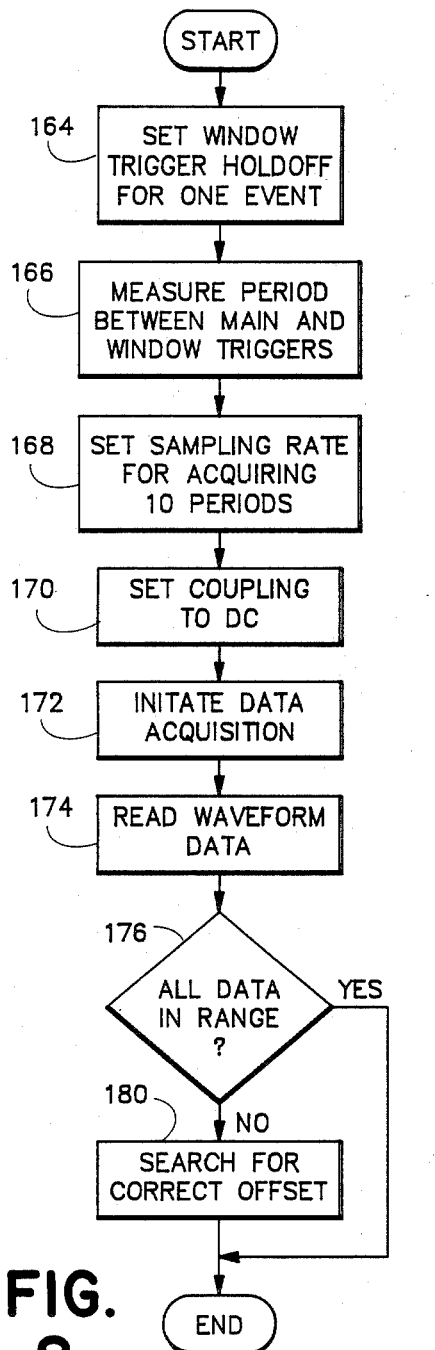
FIG. 8 is a flow chart for programming the computer of FIG. 2 according to the present invention, to adjust an offset signal applied as input to the amplifier of the vertical input system of FIG. 3.

FIG. 8 is a flow chart showing the process by which the executive microcomputer adjusts the offset so that a waveform representing the DC coupled input signal may be displayed on the screen. Starting in block 164, executive microcomputer 44 sends a command to the digitizing system microcomputer 86 of FIG. 4 to assert the holdoff signal supplied to window trigger comparator 84 until just after the main trigger comparator asserts the main trigger status signal. Thus, the window trigger status signal is asserted on the first triggering event (i.e., when the input signal rises above the window trigger level) in the input signal occurring after the trigger event which initiated the main trigger status signal. The executive microcomputer 44 also sends a command to the digitizing system microcomputer 86 to acquire data produced by the timer 104 of FIG. 5 during the next acquisition cycle (block 166) and to transmit that data back to the executive microcomputer. Since the main and window trigger levels are both set for triggering when the vertical amplifier output signal rises to a level midrange between its measured minimum and maximum peaks, the measured time between assertion of the main and window trigger status signals is equal to the period of the input signal, provided the amplifier output signal is periodic and does not contain large magnitude higher frequency harmonic components or excessively large noise components.

If the amplifier output signal does contain large magnitude, higher frequency harmonic components, the period between the main and trigger status signals will be somewhat shorter than the period of the lowest frequency component of the amplifier output signal. To improve the chances that at least one complete cycle of the amplifier output signal is digitized during an acquisition cycle, executive microcomputer 44 transmits a command to the digitizing system microcomputer 86 telling it to set the sampling rate of the main digitizer 100 so the acquisition cycle of the digitizer spans a time equal to ten of the periods measured by timer 104 (block 168).

Next (block 170), executive microcomputer 44 transmits a message to the I/O circuitry 50 telling it to close switch 72 of FIG. 3 by placing the appropriate data in registers 74 so that capacitor 68 is shorted and the input signal is DC coupled to the input of vertical amplifier 62. Microcomputer 44 then initiates waveform data acquisition (block 172) by sending a command to the digitizer microcomputer, and thereafter (block 174) checks the resulting waveform data sequence stored in the waveform memory and determines (block 176) if each datum of the sequence is within a range for which a corresponding portion of a waveform will be displayed within the screen boundaries. If not, the executive microcomputer 44 (in block 180) initiates the previously discussed binary search, whereby the vertical offset signal applied to the vertical amplifier is adjusted by progressively smaller amounts until the waveform data sequence stored in the waveform memory indicates that the waveform display is appropriately positioned on the screen. The program ends thereafter.

Figure 9:
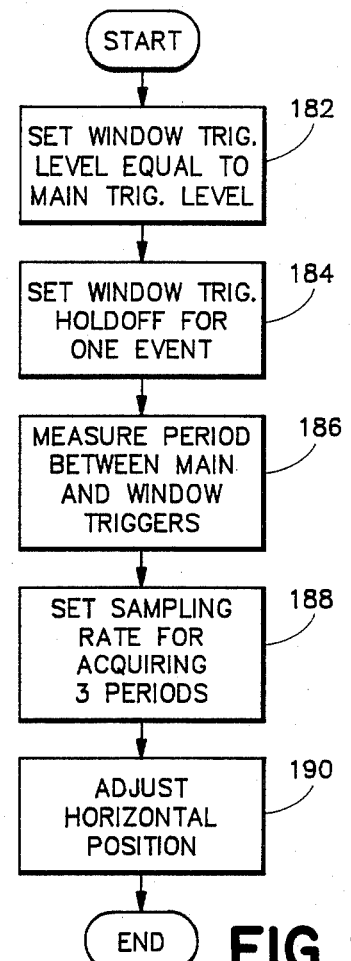
FIG. 9 is a flow chart for programming the computer of FIG. 2 according to the present invention, to adjust the sampling rate and horizontal position setting of the main digitizer of FIG. 5.

After the gain and offset have been set, an autoset program as charted in FIG. 9 is executed whereby the sampling rate and the horizontal position of the waveform are adjusted so that three cycles of the waveform are displayed, with the triggering event appearing on the first horizontal grid division. This program is also executed after blocks 107 and 110 of FIG. 6 are executed, wherein the gain is set for TTL or ECL levels. With reference to FIG. 9, starting in block 182, window trigger level is set equal to the main trigger level, the window trigger holdoff is set to one event (block 184), and the period between the main and window trigger status signals is measured (block 186). The digitizer sampling rate is then set so that three periods of the waveform will be displayed (block 188), and the horizontal position data input to the digitizer is set so that the triggering event is displayed one horizontal grid from the left edge of the grid.

As has been previously mentioned, the operator selects a waveform to be autoset by touching the waveform on the screen and then depresses an "autoset" pushbutton on the front panel of the oscilloscope to initiate the autoset procedure. However, the operator may select a waveform and initiate the autoset procedure in another way. With reference to FIG. 2, each probe 11 includes a pushbutton which transmits a signal by way of the corresponding plugin 20, 22 or 24 to I/O circuitry 50. Following detection of this signal, the I/O circuitry transmits data to the executive microcomputer 44 which permits the microcomputer to determine which pushbutton was depressed. When the executive microcomputer determines that a pushbutton on a probe 11 was depressed, it automatically selects the waveform associated with the input channel to which the probe is connected and initiates the autoset procedure for that waveform. Thus an operator may, for example, probe a point on a circuit and depress the pushbutton on the probe and the oscilloscope automatically adjusts itself to produce a suitable waveform display without having to touch the oscilloscope.

According to the present invention, when the operator depresses the autoset button when no waveform is selected, the control system successively checks the magnitudes of vertical amplifier output signals to determine if an input signal has been applied thereto, and when an input signal is found, the system automatically autosets and displays a waveform representing that input signal.

Figures 10, 11:
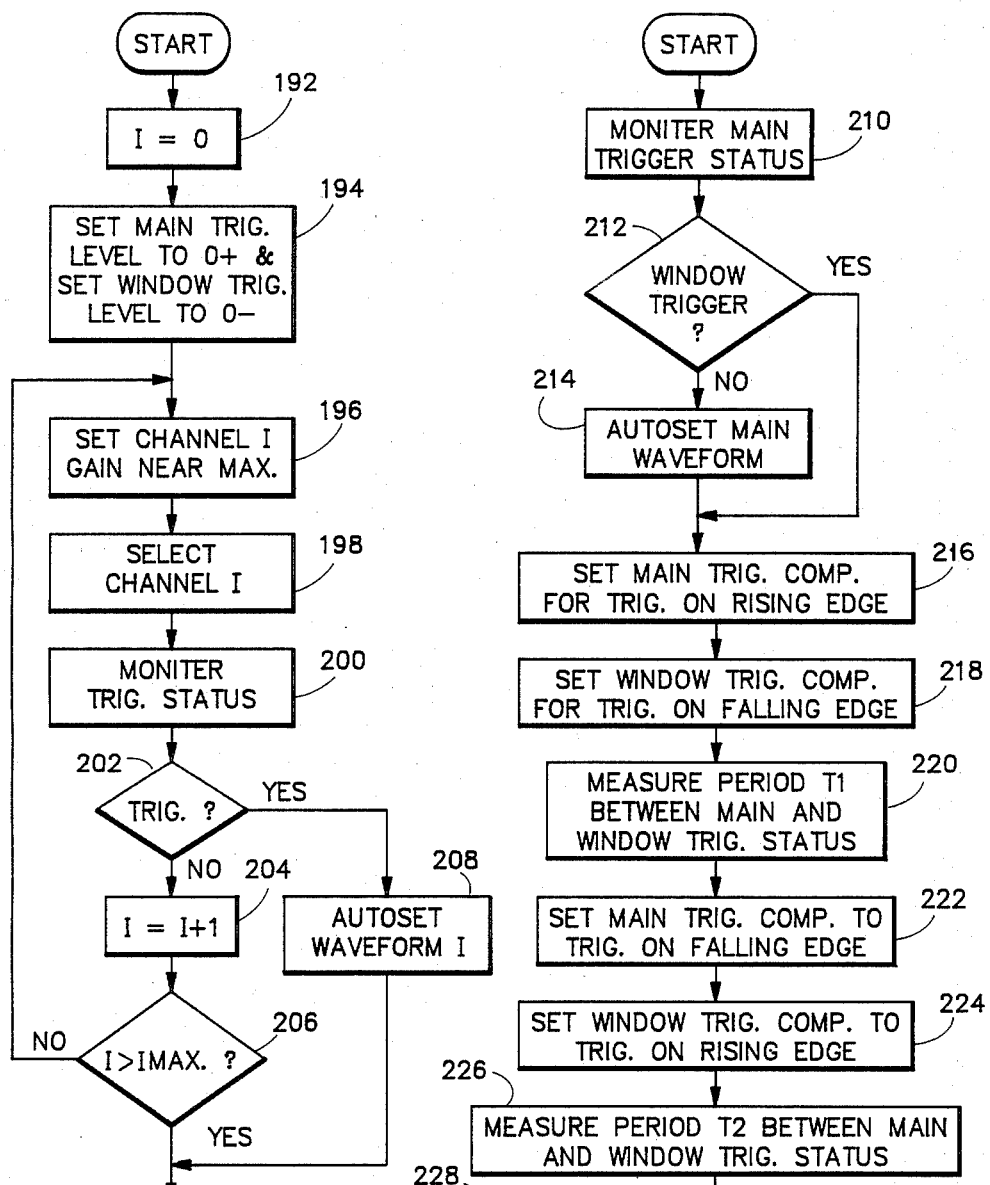
FIG. 10 is a flow chart for programming the computer of FIG. 2 according to the present invention, to select an input signal to the oscilloscope of FIG. 1 for which display parameters of a waveform representing the input signal are to be automatically adjusted.
FIG. 11 is a flow chart for programming the computer of FIG. 2 according to the present invention, to automatically adjust the display of a window axis waveform displayed on the screen of the oscilloscope of FIG. 10.

FIG. 10 is a flow chart for a program for executive microcomputer 44 utilized to check the magnitudes of amplifier output signals and to initiate the autoset process when an active signal is located. Starting in block 192, a counter I is set to 0, and in block 194, the main trigger level is set to slightly above 0 divisions and the window trigger level is set to slightly below 0 divisions. The gain of the vertical amplifier associated with vertical input channel I is set near maximum, suitably to 0.005 volts/division, (block 196) and the output of that amplifier is selected as the input to the main and window trigger comparators and main digitizer (block 198). The main and window trigger status signals are then monitored for 20 msecs and if asserted, the autoset programs according to FIGS. 6-9 are executed so as to autoset a waveform to represent the input signal (block 208) and the program ends. After block 202 if no trigger status signal is detected for channel I, the value of I is incremented, and if I does not exceed a maximum channel number (IMAX), the program returns to block 196.

The program continues to loop through blocks 196-206 until a waveform has been autoset, or until I exceeds IMAX (block 206), at which point the program ends.

As previously mentioned, a "window" waveform is a horizontally expanded section of a "main" waveform and is produced by utilizing the window digitizer to digitize the same vertical amplifier output signal digitized by the main digitizer, but at a higher sampling rate. An operator may manually adjust the section of a main waveform to be covered by the window waveform by utilizing control knobs 16 of FIG. 1 to adjust the length and position of the highlighted area on the main waveform. The executive microcomputer automatically adjusts the sampling rate, window trigger level and horizontal position setting of the window digitizer so that the window waveform corresponds to the highlighted area on the main waveform.

Figure 12:
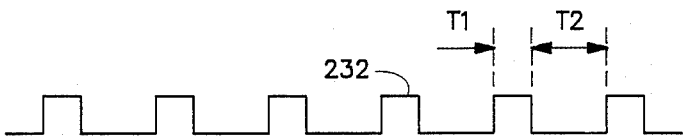
FIG. 12 depicts a typical waveform display.

However, according to the present invention, when the operator selects a window waveform and then depresses the autoset pushbutton, a program flow charted in FIG. 11 is executed whereby the sampling rate, trigger level and horizontal position setting of the window digitizer are automatically set so that a particular portion of the main waveform associated with the selected window waveform is displayed. Starting in block 210, the executive microcomputer initially causes the digitizing system microcomputer to monitor the main trigger status signal for 20 msecs in order to determine if the "main" waveform is being triggered. If not (block 212), the autoset programs of FIGS. 6-9 are executed so as to autoset the main waveform (block 214). If the main waveform is being triggered (block 212) or after the main waveform is autoset (block 214), then the main trigger comparator is set for triggering on a rising edge of the main trigger signal (block 216), and the window trigger comparator is set to trigger on a falling edge of the window trigger signal (block 218), but at the same level as the main trigger level signal. The executive microcomputer then commands the digitizing system microcomputer to utilize the timer 104 of FIG. 5 to measure a time period T1 between the rising and falling edges of one cycle of the waveform. Thereafter, the main trigger comparator is set to trigger on a falling edge (block 222), the window trigger comparator is set to trigger on a rising edge (block 224), and a period T2 between the falling and rising edges of one cycle of the waveform is measured (block 226). FIG. 12 depicts a typical main waveform 232 and shows the periods T1 and T2 measured into blocks 220 and 226 of FIG. 11. Referring to FIG. 11, after periods T1 and T2 are measured, the window trigger comparator sense whether it triggers on a rising or falling edge, and the window digitizer sampling rate is set such that the window waveform covers substantially either the section of the main waveform occurring during time T1 or the section occurring during time T2, whichever is narrowest (block 228). Thereafter, the horizontal position setting of the window digitizer is adjusted so that the triggering event appears one horizontal grid division from the left edge of the grid (block 230.)

Thus the oscilloscope of the present invention is adapted to automatically adjust operating parameters which control the display of an operator-selected waveform. The vertical size and position of the waveform are adjusted by adjusting the gain and offset of the vertical amplifier and the horizontal scaling of the waveform is adjusted by adjusting the sampling rate of the digitizer. The oscilloscope also automatically sets the trigger level to provide for proper triggering and adjusts horizontal position data supplied to the digitizer so as to suitably adjust the horizontal position of the waveform on the screen. The oscilloscope is also adapted to check for active input signals and to automatically adjust these operating parameters so that waveforms suitably representative of each active input signal are displayed.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. In an oscilloscope comprising an amplifier having adjustable gain for amplifying a time varying input signal to produce a n output signal, comparator means for producing a first trigger status signal when the amplifier output signal rises above a first trigger level and for producing a second trigger status signal when the amplifier output signal falls below a second trigger level, and control means for adjusting said amplifier gain and for detecting assertion of said first and second trigger status signals, a method for said control means for adjusting said amplifier gain, the method comprising the steps of:
   a. adjusting said amplifier gain to a predetermined initial value that is between a maximum and minimum amplifier gain and applying said time varying input signal as input to said amplifier;
   b. iteratively increasing the amplifier gain when neither of said first and second trigger status signals are detected until at least one of said first and second trigger status signals are detected; and
   c. iteratively decreasing the amplifier gain when at least one of said first and second trigger status signals is detected until neither of said first and second trigger status signals are detected.

2. The method according to claim 1 wherein the gain is iteratively increased in step b by a larger factor than it is iteratively decreased in step c.

3. In an oscilloscope comprising an amplifier having adjustable gain and offset for producing an output signal in response to a signal coupled as input to said amplifier, coupling means for selectively either capacitively or directly coupling an input signal to said amplifier, digitizing means for generating a waveform data sequence representing magnitudes of successive portions of said amplifier output signal, comparator means for producing a first trigger status signal when the amplifier output signal rises above a first trigger level and for producing a second trigger status signal when the amplifier output signal falls below a second trigger level, and control means for adjusting gain and offset of said amplifier, for controlling whether said coupling means capacitively or directly couples said input signal to said amplifier, for monitoring magnitudes of said waveform data sequence, and for detecting said first and second trigger status signals, a method for said control means for adjusting said amplifier gain and offset comprising the steps of:
   a. controlling said coupling means to capacitively couple said input signal to said amplifier;
   b. adjusting said amplifier gain to an initial value;
   c. adjusting said amplifier for substantially zero offset;
   d. increasing the amplifier gain until at least one of said first and second trigger status signals is detected;
   e. decreasing the amplifier gain until neither of said first and second trigger status signals is detected;
   f. controlling said coupling means so that it directly couples said input signal to said amplifier;
   g. adjusting the amplifier offset such that the magnitude of each datum comprising said waveform data sequence produced by said digitizing means is within predetermined limits.

4. In an oscilloscope comprising an amplifier having adjustable gain and offset for producing an output signal in response to a signal coupled as input to said amplifier, coupling means for alternatively capacitively and directly coupling an input signal to said amplifier, comparator means for producing a first trigger status signal when the amplifier output signal reaches a first trigger level and for producing a second trigger status signal when the amplifier output signal reaches a second trigger level, digitizing means for sampling said output signal at an adjustable sampling rate and for generating a waveform data sequence representing magnitudes of successive samples of said output signal, control means for adjusting gain and offset of said amplifier, for controlling whether said coupling means capacitively or directly couples said input signal to said amplifier, for reading magnitudes of said waveform data sequence, for detecting said first and second trigger status signals, and for determining a time interval between production of said first and second trigger status signals, a method for said control means for adjusting oscilloscope operation, the method comprising the steps of:
   a. controlling said coupling means to capacitively couple said input signal to said amplifier;
   b. adjusting said amplifier gain to an initial value;
   c. adjusting said amplifier for substantially zero offset;
   d. increasing the amplifier gain until at least one of said first and second trigger status signals is detected;
   e. decreasing the amplifier gain until neither of said first and second trigger status signals is detected;
   f. measuring a time interval between production of said first and second trigger status signals; and
   g. adjusting said sampling rate of said digitizer according to said measured time interval.

5. The method according to claim 4 further comprising the steps of:
   i. controlling said coupling means so that it directly couples said input signal to said amplifier; and
   j. adjusting the offset of said amplifier such that the magnitude of each datum comprising said waveform data sequence produced by said digitizing means is within predetermined limits.

6. In an oscilloscope comprising an amplifier having adjustable gain for producing an output signal in response to a signal coupled as input to said amplifier, digitizing means for periodically sampling the amplifier output and for generating a waveform data sequence representing magnitudes of successive samples of said amplifier output signal, comparator means for producing a first trigger status signal when the amplifier output signal reaches an adjustable first trigger level and for producing a second trigger status signal when the amplifier output signal reaches an adjustable second trigger level, control means for adjusting gain and offset of said amplifier, for reading magnitudes of said waveform data sequence, for detecting said first and second trigger status signals, and for adjusting said first and second trigger levels, a method for said control means for adjusting oscilloscope operation, the method comprising the steps of:
   a. adjusting said amplifier gain to an initial value;
   b. increasing the amplifier gain until at least one of said first and second trigger status signals is detected;
   c. decreasing the amplifier gain until neither of said first and second trigger status signals is detected;
   d. iteratively adjusting said first trigger level and monitoring said first trigger status signal to determine a particular first trigger level substantially near a maximum peak of said amplifier output signal;
   e. iteratively adjusting said second trigger level and monitoring said second trigger status signal to determine a particular second trigger level substantially near a minimum peak of said amplifier output signal; and
   f. adjusting one of said first and second trigger levels to a level between said particular first trigger level and said particular second trigger level.

7. In an oscilloscope comprising an amplifier having adjustable gain for producing an output signal in response to a signal coupled as input to said amplifier, coupling means for alternatively capacitively and directly coupling an input signal to said amplifier, digitizing means for periodically sampling the amplifier output signal at an adjustable sampling rate, and for generating a waveform data sequence representing magnitudes of successive samples of said amplifier output signal, comparator means for producing a first trigger status signal when the amplifier output signal reaches an adjustable first trigger level and for producing a second trigger status signal when the amplifier output signal reaches an adjustable second trigger level, control means for adjusting gain and offset of said amplifier, for controlling whether said coupling means capacitively or directly couples said input signal to said amplifier, for reading magnitudes of said waveform data sequence, for controlling sampling rate of said digitizer, for adjusting said first and second trigger levels, for detecting said first and second trigger status signals, and for determining a time interval between production of said first and second trigger status signals, a method for said control means for adjusting oscilloscope operation, the method comprising the steps of:
   a. controlling said coupling means to capacitively couple said input signal to said amplifier;
   b. adjusting said amplifier gain to an initial value;
   c. adjusting said amplifier for substantially zero offset;
   d. increasing the amplifier gain until at least one of said first and second trigger status signals is detected;
   e. decreasing the amplifier gain until neither of said first and second trigger status signals is detected;
   f. iteratively adjusting said first trigger level and monitoring said first trigger status signal to determine a particular first trigger level substantially near a maximum peak of said amplifier output signal;
   g. iteratively adjusting said second trigger level and monitoring said second trigger status signal to determine a particular second trigger level substantially near a minimum peak of said amplifier output signal;
   h. adjusting said first and second trigger levels to a level between said particular first trigger level and said particular second trigger level;
   i. measuring a time interval between production of said first and second trigger status signals; and
   j. adjusting said sampling rate of said digitizer according to said measured time interval.

8. The method according to claim 7 further comprising the steps of:
   controlling said coupling means so that it directly couples said input signal to said amplifier; and
   m. adjusting the offset of said amplifier such that the magnitude of each datum comprising said waveform data sequence produced by said digitizing means is within predetermined limits.

9. In an oscilloscope comprising an amplifier having adjustable gain for producing a periodic output signal in response to a periodic input signal, comparator means for producing a first trigger status signal when the amplifier output signal rises above an adjustable first trigger level and for producing a second trigger status signal when said amplifier output signal falls below an adjustable second trigger level, digitizing means for periodically sampling the amplifier output signal at an adjustable sampling rate, and for generating a waveform data sequence representing magnitudes of successive samples of said amplifier output signal starting with a pariticular sample acquired an adjustable number of samples following production of one of said first and second trigger status signals, and control means for adjusting the gain of said amplifier, for controlling sampling rate of said digitizer, for adjusting said first and second trigger levels, and for detecting said first and second trigger status signals, a method for said control means for adjusting oscilloscope operation, the method comprising the steps of:
   adjusting said samplifier gain to a predetermined initial value that is between a maximum and minimum amplifier gain;
   increasing the amplifier gain when neither of said first and second trigger status signals are detected;
   decreasing the amplifier gain when at least one of said first and second trigger status signals is detected;
   adjusting one of said first and second trigger levels such that said one trigger level is between minimum and maximum peaks of said amplifier output signal; and
   adjusting said sampling rate such that said waveform data sequence represents magnitudes of successive samples of a predetermined number of periods of said amplifier output signal.

10. The method according to claim 9 further comprising the step of adjusting said adjsutable number such that said particular sample is acquired a predetermined number of samples following production of said one trigger status signal.

* * * * *